United States Patent [19]

Kinsman et al.

[11] Patent Number: 5,093,638

[45] Date of Patent: Mar. 3, 1992

[54] UNBALANCED SAW FILTER

[75] Inventors: Robert G. Kinsman, Naperville; Richard S. Bickham, Algonquin, both of Ill.

[73] Assignee: Motorola, Inc., Schaumburg, Ill.

[21] Appl. No.: 608,866

[22] Filed: Nov. 5, 1990

[51] Int. Cl.⁵ .............................................. H03H 9/64
[52] U.S. Cl. ................................. 333/195; 310/313 R
[58] Field of Search ............................. 333/193–196, 333/150, 154, 133, 132, 129; 310/313 R, 313 B, 313 C, 313 D

[56] References Cited

U.S. PATENT DOCUMENTS

| 4,409,567 | 10/1983 | Setsune et al. | 333/194 X |
| 4,485,363 | 11/1984 | Hunsinger et al. | 333/193 |
| 4,785,270 | 11/1988 | Kinsman | 333/193 |

FOREIGN PATENT DOCUMENTS 0029109  1/1990  Japan .................................. 333/193

Primary Examiner—Eugene R. LaRoche
Assistant Examiner—Seung Ham
Attorney, Agent, or Firm—Jon P. Christensen

[57] ABSTRACT

An unbalanced surface acoustic wave (SAW) resonator-filter is achieved by using a predetermined length of unbalanced transmission line to define a ground potential and permit two SAW resonators and such transmission line to function together as an unbalanced filter.

8 Claims, 4 Drawing Sheets

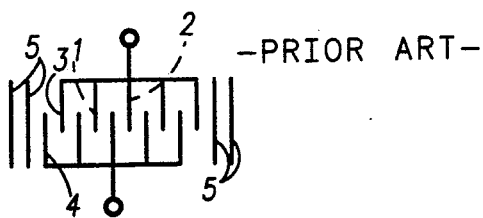
FIG.1 —PRIOR ART—
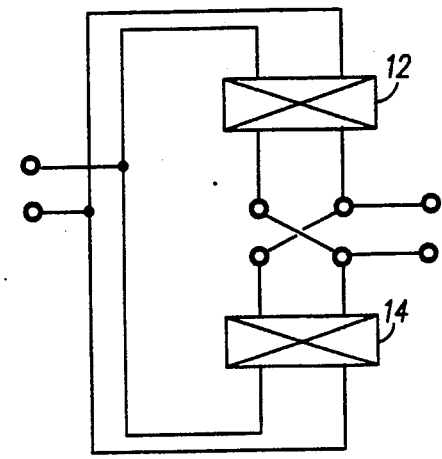
FIG.2 —PRIOR ART—
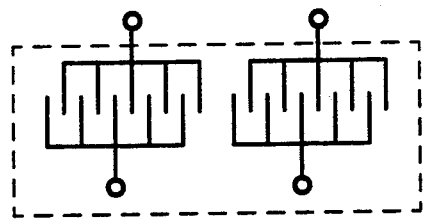
FIG.3 —PRIOR ART—
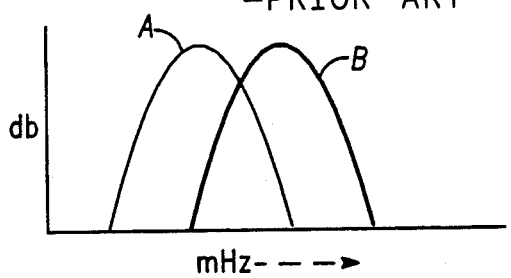
FIG.4 —PRIOR ART—
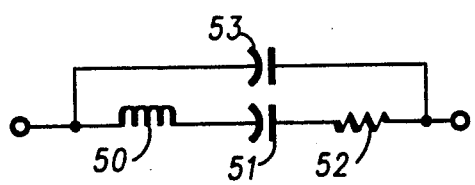
FIG.12
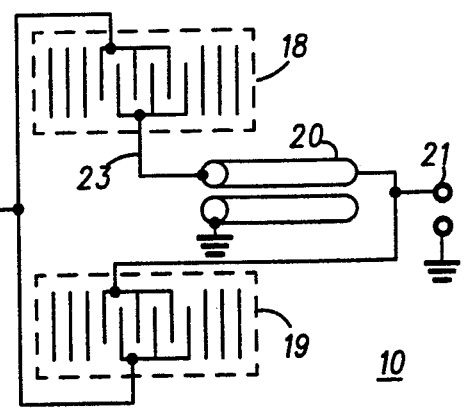
FIG.5

CIRCUIT ELEMENT VALUES

Resonator X1

Series resonance frequency = 847 MHz $L_m$ = 3.16 μH

Q = 10,000

$C_o$ = 1.9 pF.

Resonator X2

Series resonance frequency = 850 MHz $L_m$ = 3.16 μH

Q = 10,000

$C_o$ = 1.9 pF.

Transmission Line

Microstrip meander line $Z_o$ = 50 ohms

Length = 1/2 wavelength at 848.5 MHz

Filter Termination impedance = 50 ohms

*FIG. 8*

UNBALANCED SAW FILTER

FIELD OF THE INVENTION

This invention relates generally to the field of electrical filters and more specifically to RF signal processing.

BACKGROUND OF THE INVENTION

Surface acoustic wave (SAW) resonators are known. Such resonators are typically comprised of two sets of interdigitated, or interleaved, parallel conductors deposited on a piezoelectric substrate. FIG. 1 depicts the conductors of a SAW resonator.

SAW resonators typically operate at relatively high frequencies (e.g. at or above 100 MHz). An AC signal applied to the terminal of a SAW resonator causes an time-varying electric field to be impressed upon the piezoelectric material forming the SAW resonator. The electric field causes mechanical stress within the piezoelectric substrate in the vicinity of the terminal and a resultant acoustic wave within the substrate. The acoustic wave propagates through the substrate from one set of electrodes to an opposing set of electrodes. As the wave approaches the opposing set of electrodes the acoustic wave interacting with the piezoelectric substrate induces an electric field in the opposing electrodes. In the creation of the electric field in the opposing electrodes, part of the acoustic wave may be absorbed and part of the acoustic wave may be reflected back towards the originating electrodes. The part of the wave that is absorbed becomes the output of the SAW. The reflected wave travels back towards the originating electrode. At the input electrode part of the wave may again be reflected and part of the wave absorbed. As the wave travels toward the output electrode the reflection-absorption process may be repeated a number of times, similar to the operation of a tank circuit.

If, when the original wave arrives back at the origin, the input signal has reached its maximum, the reflected wave will be reinforced and become larger than the original transmitted wave. If, on the other hand, the input signal has not reached a maximum then the reflected signal will become attenuated at each point of reflection.

Depending upon, in part, the spacing of the electrodes within a SAW resonator and the wavelength of applied signals the reinforcement and attenuation of signals occurs at specific frequencies allowing the SAW resonator to act as a filter. Signals whose frequency reinforce reflected waves will be transmitted while other signal will be attenuated.

A SAW resonator will resonate over a relatively narrow range of frequencies due to differences in propagation paths within the SAW resonator. The propagation delay time for a signal wave transmitted between the innermost electrodes (1 and 2) may be the shortest (highest frequency) whereas the propagation delay time between the outermost electrodes (3 and 4) may be the longest (lowest frequency). The difference in frequencies determined by propagation delays may define the bandwidth of the SAW resonator. Bandwidth for SAW resonators (as with filters in general) is defined as the frequency difference between which an output signal has fallen 3 db from a maximum amplitude at a center of the resonant frequency to the 3 db point on either side.

As is known in the prior art, a single SAW resonator can be used as a bandpass filter by interconnecting the device in series between a source and a load. The arrangement, however, is only useful for very narrow bandwidths because of limitations caused by the shunt capacitance of the resonator.

For an unweighted transducer pattern (FIG. 1) (all interdigitated electrodes of equal length and equal spacing of electrodes across the transducer) the input impedance in the vicinity of the resonance frequency can be approximated by a series resonance circuit (50, 51, 52, FIG. 12) in parallel with a shunt capacitor (53). The resonant frequency of the transducer is determined by an interaction of the electrode spacing and the velocity of the acoustic wave. At the center frequency the physical separation between adjacent electrodes is equal to one-half wavelength of the acoustic wave. The Q (where Q is equal to reactive impedance over resistance) is a direct function of the number of electrode pairs in the transducer and the resonator inductance is a function of the piezoelectric coupling coefficient of the substrate material. The shunt capacitor represents the static capacitance between the electrodes in the transducer pattern.

When a constant amplitude, variable frequency input signal is applied to a SAW resonator used as a filter, a phase shift occurs in the output signal as the input signal frequency passes through the resonant frequency. The phase shift substantially equals 180 degrees from a first frequency below the resonant frequency to second frequency above the resonant frequency.

SAW filters having relatively wide bandwidths have been constructed using combinations of SAW resonators having different resonant frequencies. FIG. 2 is an example of a lattice filter using two dual port SAW elements. FIG. 3 depicts the dual port SAW resonator used in FIG. 2.

Shown in FIG. 2 is a filter comprised of a first dual port SAW resonator (12) having a first resonant frequency and a second dual port SAW resonator (14) having a second resonant frequency. The output of the first SAW resonator (12) has been connected to the output of the second SAW resonator (14) in opposite phase. The opposite phase connections of the outputs of the two SAW resonators (12 and 14) is necessary because of a phase change occuring in the output signal of one of the two SAW resonators (12 and 14) as the resonator passes through its resonant frequency. The reversal of connections on the outputs of the two SAW resonators (12 and 14) substantially avoids cancellation of signals occuring over a frequency range between the two resonant frequencies.

Operation of the SAW filter (FIG. 2) provides an output substantially as shown in FIG. 4. with the lowest resonant frequency SAW resonator providing the output shown by the curve on the left (A) and the higher frequency SAW resonator providing the output shown by the curve on the right (B). Since the outputs of the SAW resonators have been connected in opposite phase the output signals of the two SAW resonators (12 and 14) are added to provide a SAW filter (FIG. 2) output (C, FIG. 4). The SAW filter (FIG. 2) resultant (C) is a summation of the curves (A and B) having a bandwidth substantially equal to the sum of the two bandwidths of the individual SAW resonators (12 and 14).

A disadvantage of the depicted SAW filter (FIG. 2) is that (because of the opposite phase connections) it must be operated as a balanced filter. A balanced filter, as is known, must operate without grounded inputs or outputs.

Unbalanced filters are known in the art. Unbalanced filters are typically more economical to use than balanced filters because of the reduced circuit complexity associated with grounded circuitry. Because of the importance of high frequency circuits a need exists for a way to construct unbalanced filters using SAW resonators. Such a construction would have significant value in high frequency applications such as radios or other signal processing.

SUMMARY OF THE INVENTION

Pursuant to one embodiment of the invention, an RF filter is offered comprising a first SAW resonator (having a first resonant frequency), a second SAW resonator (having a second resonant frequency), and a grounded transmission line having an electrical length substantially equal to one half the wavelength of the average resonant frequency of the first and second SAW resonators. The input and output of the RF filter are defined by a parallel connection of the second SAW resonator to a series connected first SAW resonator and grounded transmission line. The ground reference for the RF filter is provided by the ground connection on the grounded transmission line.

In the preferred embodiment the grounded transmission line comprises of a single, ungrounded conductor proximate to a ground plane such as a stripline or microstrip. The ground of the grounded transmission line is defined by a connection to the ground plane, proximate to the ungrounded transmission line conductor. The length of the ungrounded conductor of the transmission line is defined by one-half wavelength of an electromagnetic input signal of a frequency substantially equal to the average of the first and second resonant frequency. It should be apparent to a person skilled in the art that the length of the transmission line may also be any odd-numbered multiple of one-half the average frequency.

BRIEF DESCRIPTION OF THE DRAWINGS

FIG. 1 depicts a prior art SAW resonator.

FIG. 2 depicts a prior art lattice circuit comprised of SAW resonators.

FIG. 3 depicts a prior art dual port SAW transducer.

FIG. 4 depicts a plot or graph of output frequency versus amplitude response of a lattice type SAW filter.

FIG. 5 depicts a two-pole SAW filter under the invention.

FIG. 8 comprises a table of electrical characteristics of a four-pole SAW filter constructed to operate above 800 MHz.

FIG. 12 comprises an equivalent circuit of a SAW resonator.

DESCRIPTION OF A PREFERRED EMBODIMENT

Figure 6:
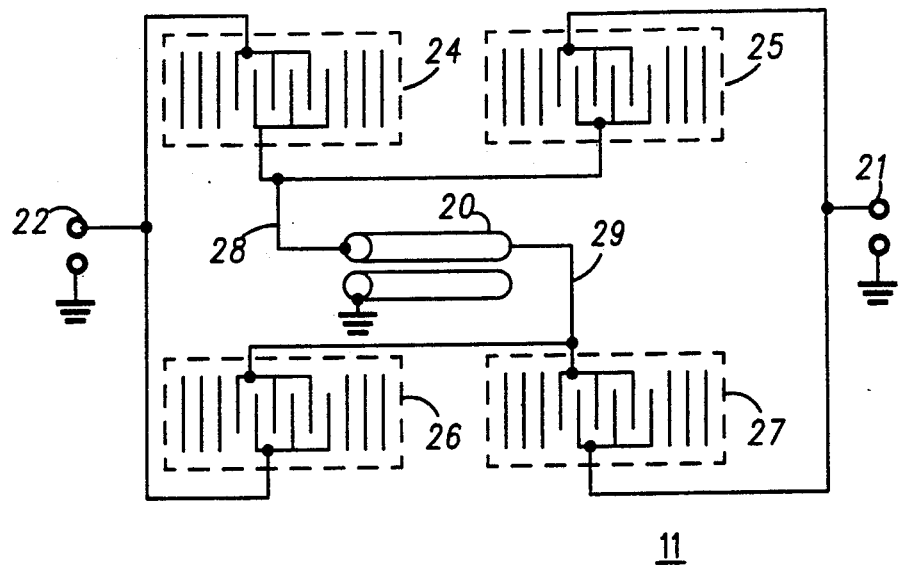
FIG. 6 depicts a four-pole SAW filter under the invention.

FIG. 5 shows a schematic diagram of an unbalanced two-pole SAW resonator filter (10). Included within the filter (10) is a first SAW resonator (18) having an input (22), an output (23) and having a first resonant frequency (f1). Also included within the filter (10) is a second SAW resonator (19) having an input (22), an output (21), and a second resonant frequency (f2). Connected in series with the first SAW resonator (18) is a transmission line (20) also having an input (23) and an output (21).

The electrical length of the transmission line (20) is chosen to be substantially equal to one-half wavelength of the average resonant frequency of the two SAW resonators (18 and 19). Construction of the grounded transmission line (20) with a dimension equal to the one-half wavelength causes a 180 degree phase shift between an input to the transmission line (23) and an output (21).

The first SAW resonator (18) is arbitrarily chosen to be of the lowest resonant frequency (f1). As a signal is applied to the input (22) of the first SAW resonator (18), and as the frequency of an input signal exceeds the resonant frequency of the first SAW resonator (18), the phase of the signal from the output of the first SAW resonator (18) changes with respect to the input signal by substantially 180 degrees. The series connection of the grounded transmission line (20) to the output (23) of the first SAW resonator (18) produces an additional 180 degree phase shift measured at the output of the transmission line (21) because its length is nearly one-half wavelength. The net result of the inclusion of the transmission line (20) is that the signal at the output (21) of the transmission line (20) and of SAW resonator (19) remain substantially in phase throughout both resonant frequencies (f1 and f2).

As a frequency of a signal at the input (22) of the SAW filter (10) approaches the resonant frequency (f1) of the first SAW resonator (18) the impedance of the second SAW resonator (19) remains at a high level. No contribution, consequently, is made at the output (21) by the second SAW resonator (19).

As a frequency of a signal at the input (22) of the SAW filter (10) exceeds the resonant frequency (f1) of the first SAW resonator (18) and begins to approach the resonant frequency (f2) of the second SAW resonator (19) the output signal at the output (21) from the first SAW resonator (18) begins to decrease as the output from the second SAW resonator (19) begins to increase. If the resonant frequency (f2) for the second SAW resonator (19) is chosen sufficiently close to the resonant frequency (f1) of the first SAW resonator (18) then a contribution from the output of the second SAW resonator (19) will contribute to the output of the filter (10) and the output (21) of the SAW filter (10) will remain relatively constant over the frequency range of the first and second resonant frequencies (f1 and f2).

As a frequency of a signal at the input (22) exceeds the second resonant frequency (f2) an output is being provided at the output (21) of the SAW filter (10) substantially from the second SAW resonator (19). At an input frequency substantially above the second resonant frequency (f2) the impedance of the first SAW resonator (18) has increased to a relatively high value and is not contributing to an output signal at the output (21).

It should be readily apparent to those familiar in the art of RF filters that the inputs (22) and the outputs (21) of the two-pole SAW filter (10) shown in FIG. 5 may be reversed without affecting the performance of the SAW filter (10). The analysis of providing an input signal to an input (21) and receiving an output signal at an output

(22) is the same except for the direction of signal propagation.

FIG. 6 shows another embodiment of an unbalanced SAW filter in the form of a four-pole bandpass filter (11). Shown within the four-pole bandpass filter (11) are a first set of two SAW resonators (24 and 25), both having a substantially identical first resonant frequency (f1). Also included is a second set of SAW resonators (26 and 27), both having a substantially identical second resonant frequency (f2). A one-half wavelength transmission line (20) is connected therebetween. As above the transmission line (20) has an electrical length substantially equal to the wavelength of one-half the average of f1 and f2.

It should be apparent that the four-pole SAW filter (FIG. 6) can be constructed of a first two-pole SAW filter (FIG. 5) connected in series with a second, reversed, two-pole SAW filter. A reversed two-pole SAW filter is the SAW filter shown (FIG. 5) in which an input signal is applied at an input terminal (21) and an output signal is detected at an output terminal (22).

Figure 9:
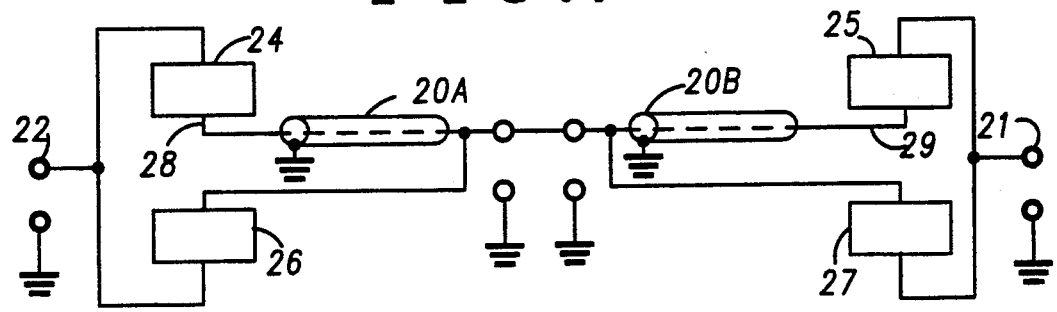
FIG. 9 depicts a four-pole SAW filter constructed of two two-pole SAW filters.

FIG. 9 is a schematic depicting such a four-pole SAW filter constructed of a first two-pole SAW filter (FIG. 5) and a second, reversed, two-pole SAW filter. FIG. 9 depicts a four-pole SAW filter in which SAW resonators 24 and 25 are constructed having a first resonant frequency (f1) and SAW resonators 26 and 27 are constructed having a second resonant frequency (f2).

Since the grounded transmission lines shown in FIG. 9 (20a and 20b) each produce 180 degrees of phase shift to the outputs (360 degrees total) then the output (28) of SAW resonator 24 is substantially in phase with the input (29) of SAW resonator 25. Since the function of the grounded transmission line (20a and 20b) is to provide a phase shift it should be apparent that the input (29) of SAW resonator 25 may be connected to the output (28) of SAW resonator 24 with no substantial change in filter operation. Such a connection would allow for the elimination of one transmission line (20b) yielding the resulting four-pole SAW filter (11) shown in FIG. 6.

Shown (FIG. 7) is another alternate embodiment of an unbalanced SAW filter constructed on a piezoelectric substrate (30). The first set of SAW resonators (24 and 25) are constructed to have a resonant frequency of 847 MHz. The second set of SAW resonators (26 and 27) are constructed to have a resonant frequency of 850 MHz. The one-half wavelength transmission line (20) is constructed with an equivalent length equal to one-half wavelength at 848.5 MHz. The ground plane (not shown) for the transmission line (20) is comprised of a metal (typically aluminum) plated on the back of the substrate (30).

Figure 7:
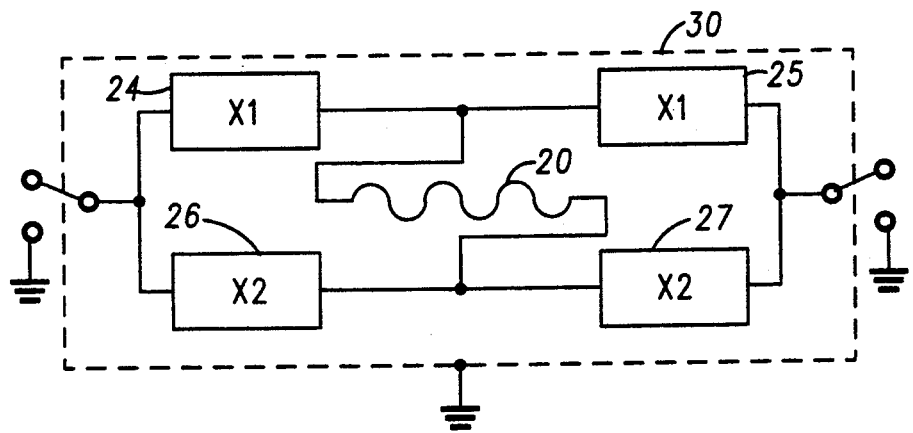
FIG. 7 depicts construction of a four-pole SAW filter on a substrate.
Figure 11:
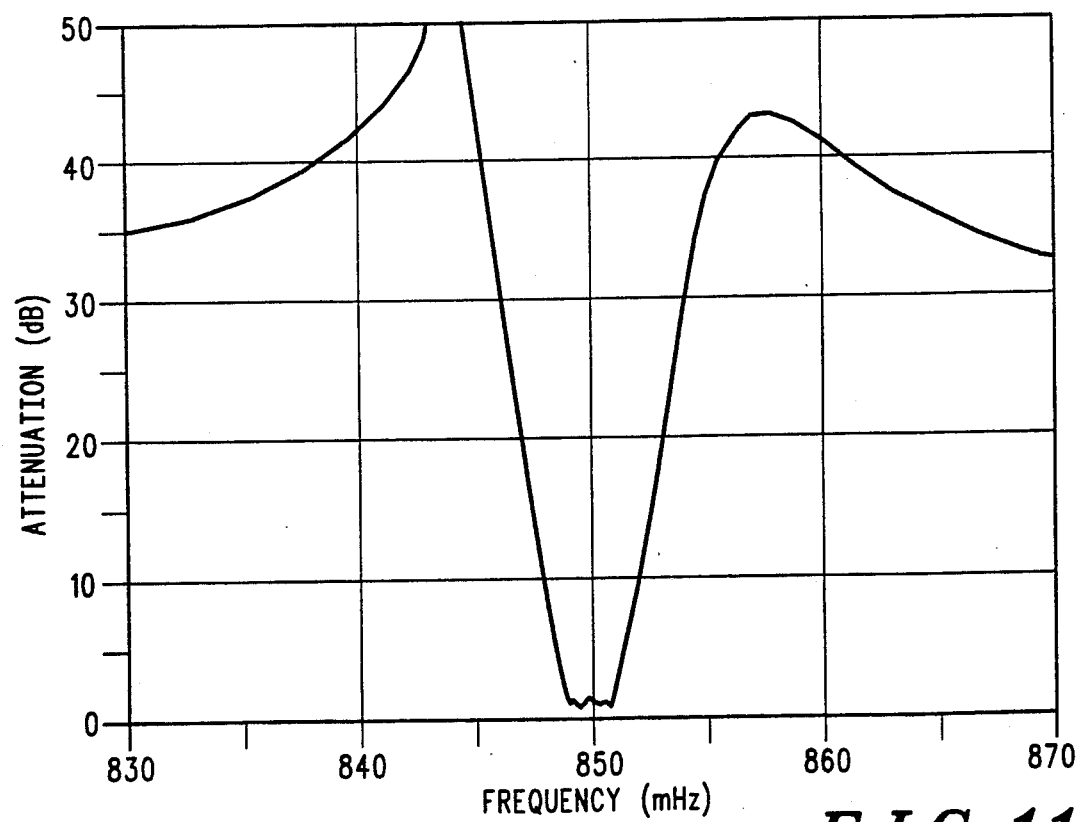
FIG. 11 comprises a frequency versus amplitude graph of a four-pole SAW filter.

FIG. 8 is a compilation of electrical data enabling a person skilled in the art to construct the unbalanced four pole filter (FIG. 6) on a substrate substantially as shown in FIG. 7. Shown (FIG. 11) is a frequency versus attenuation graph of the filter constructed using such parameters. As shown the bandwidth of such a filter has a bandwidth of substantially 4.5 MHz.

Figure 10:
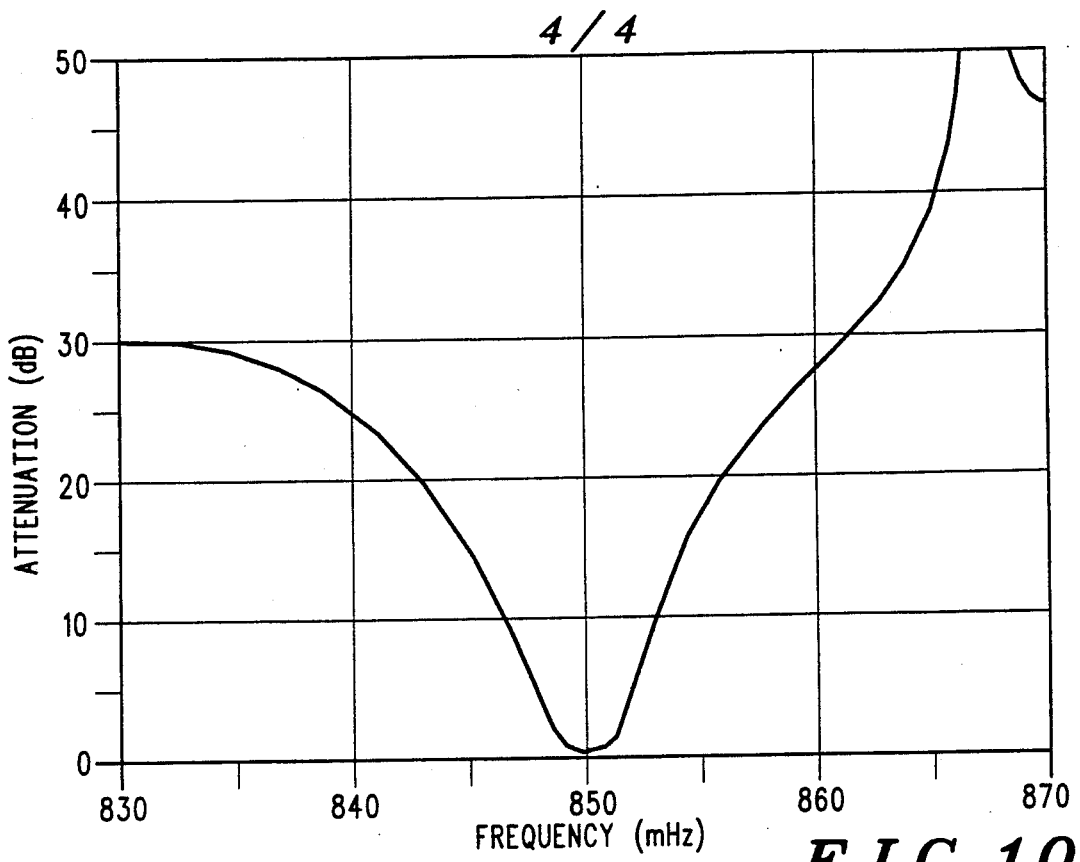
FIG. 10 comprises a frequency versus amplitude graph of a two-pole SAW filter.

The compilation of data (FIG. 8) may also be used to construct a two-pole SAW filter (FIG. 5). FIG. 10 is a frequency versus attenuation graph of the two-pole SAW filter shown in FIG. 5. The graph (FIG. 10) has a bandwidth of substantially 4.5 MHz.

We claim:
1. An RF filter comprising:
   A) a first SAW resonator having a first resonant frequency;
   B) a second SAW resonator having a second resonant frequency; and,
   C) a grounded transmission line, having a length substantially equal to one half the average wavelength of the first and second frequencies, connected in series with the first SAW resonator;

an input and an output of the RF filter defined by opposing ends of a parallel circuit formed by interconnection of the second SAW resonator with opposing ends of the series connected first SAW resonator and grounded transmission line, and an RF filter ground defined by a ground of the grounded transmission line.

2. The RF filter as in claim 1 wherein the grounded transmission line has a length substantially equal to an odd-numbered multiple of one-half the average wavelength.

3. The RF filter as in claim 1 wherein the grounded transmission line comprises a meander line on a substrate and a ground plane on the opposite side of the substrate.

4. The RF filter as in claim 4 wherein the substrate comprises a piezoelectric material.

5. An RF filter comprising;
   A) a first and second SAW resonator, each having a first resonant frequency, connected in series at a first midpoint to provide a first series circuit having opposing ends;
   B) a third and fourth SAW resonator, each having a second resonant frequency, connected in series at a second midpoint to provide a second series circuit having opposing ends;
   C) a grounded transmission line having a length substantially equal to one half the average wavelength of the first and second resonant frequencies, connected between the first and second midpoints, an input and an output of the RF filter defined by opposing ends of a parallel circuit formed by interconnection of the opposing ends of the first series circuit with opposing ends of the second series circuit, and an RF ground defined by a ground of the grounded transmission line.

6. The RF filter as in claim 5 wherein the grounded transmission line has a length substantially equal to an odd-numbered multiple of one-half the average wavelength.

7. The RF filter as in claim 5 wherein the grounded transmission line comprises a meander line on a substrate and a ground plane on the opposite side of the substrate.

8. The RF filter as in claim 7 wherein the substrate comprises a piezoelectric material.

* * * * *